(12) United States Patent
Setlur et al.

(10) Patent No.: US 7,094,362 B2
(45) Date of Patent: Aug. 22, 2006

(54) GARNET PHOSPHOR MATERIALS HAVING ENHANCED SPECTRAL CHARACTERISTICS

(75) Inventors: Anant Achyut Setlur, Niskayuna, NY (US); Alok Mani Srivastava, Niskayuna, NY (US); Holly Ann Comanzo, Niskayuna, NY (US); Gopi Chandran, Bangalore (IN); Shankar Venugopal, Bangalore (IN); Emil Radkov, Euclid, OH (US)

(73) Assignee: General Electric Company, Schenectady, NY (US)

(*) Notice: Subject to any disclaimer, the term of this patent is extended or adjusted under 35 U.S.C. 154(b) by 183 days.

(21) Appl. No.: 10/696,637

(22) Filed: Oct. 29, 2003

(65) Prior Publication Data

US 2005/0093442 A1    May 5, 2005

(51) Int. Cl.
*C09K 11/79* (2006.01)
*H05B 35/00* (2006.01)

(52) U.S. Cl. .............. 252/301.4 F; 313/305; 257/98; 257/100; 252/301.6 F; 252/301.4 R; 252/301.6 R

(58) Field of Classification Search ............... None
See application file for complete search history.

(56) References Cited

U.S. PATENT DOCUMENTS

| | | | |
|---|---|---|---|
| 4,550,256 A * | 10/1985 | Berkstresser et al. .... | 250/483.1 |
| 5,998,925 A * | 12/1999 | Shimizu et al. .......... | 313/503 |
| 6,069,440 A | 5/2000 | Shimizu et al. | |
| 6,203,726 B1 | 3/2001 | Danielson et al. | |
| 6,335,548 B1 * | 1/2002 | Roberts et al. .......... | 257/98 |
| 6,351,069 B1 | 2/2002 | Lowery et al. | |
| 6,409,938 B1 | 6/2002 | Comanzo | |
| 6,504,179 B1 * | 1/2003 | Ellens et al. .......... | 257/88 |
| 6,538,371 B1 | 3/2003 | Duggal et al. | |
| 6,552,487 B1 | 4/2003 | Ellens et al. | |
| 6,596,195 B1 * | 7/2003 | Srivastava et al. ..... | 252/301.4 R |
| 6,669,866 B1 * | 12/2003 | Kummer et al. ....... | 252/301.4 R |

(Continued)

FOREIGN PATENT DOCUMENTS

JP    2003-64358    3/2003

(Continued)

OTHER PUBLICATIONS

Pinalli et al, abstract for "Study of the visible spectra of Ca3Sc3Ge3O12 garent crystals doped with Ce3+ or Pr3+", Aug. 23, 2003, Optical Materials, vol. 25, Issue 1, pp. 91-99.*

(Continued)

*Primary Examiner*—C. Melissa Koslow
(74) *Attorney, Agent, or Firm*—Fay, Sharpe, Fagan, Minnich & McKee, LLP

(57) ABSTRACT

Phosphor compositions having the formulas $(Tb_{1-x-y-z-w}Y_xGd_yLu_zCe_w)_3M_rAl_{s-r}O_{12+\delta}$, where M is selected from Sc, In, Ga, Zn, or Mg, and where $0<w\leq0.3$, $0\leq x<1$, $0\leq y\leq0.4$, $0\leq z<1$, $0\leq r\leq4.5$, $4.5\leq s\leq6$, and $-1.5\leq\delta\leq1.5$; $(RE_{1-x-y}Sc_xCe_y)_2A_{3-p}B_pSi_{z-q}Ge_qO_{12+\delta}$, where RE is selected from a lanthanide ion or $Y^{3+}$, A is selected from Mg, Ca, Sr, or Ba, B is selected from Mg and Zn, and where $0\leq p\leq3$, $0\leq q\leq3$, $2.5\leq z\leq3.5$, $0\leq x\leq1$, $0\leq y\leq0.3$, $-1.5\leq\delta\leq1.5$; and $(Ca_{1-x-y-z}Sr_xBa_yCe_z)_3(Sc_{1-a-c}Lu_aD_c)_2Si_{n-w}Ge_wO_{12+\delta}$, where D is either Mg or Zn, $0\leq x<1$, $0\leq y<1$, $0<z\leq0.3$, $0\leq a<1$, $0\leq c\leq1$, $0\leq w\leq3$, $2.5\leq n\leq3.5$, and $-1.5\leq\delta\leq1.5$. Also disclosed are light emitting devices including a light source and at least one of the above phosphor compositions.

52 Claims, 7 Drawing Sheets

U.S. PATENT DOCUMENTS

| | | |
|---|---|---|
| 2002/0105587 A1 | 8/2002 | Idouji |
| 2002/0195587 A1 | 12/2002 | Srivastava et al. |
| 2004/0159846 A1* | 8/2004 | Doxsee et al. ............... 257/89 |
| 2004/0188655 A1 | 9/2004 | Wu et al. |
| 2004/0251809 A1 | 12/2004 | Shimomura et al. |
| 2005/0156496 A1* | 7/2005 | Takashima et al. ......... 313/237 |

FOREIGN PATENT DOCUMENTS

| | | |
|---|---|---|
| WO | WO 00/33390 | 6/2000 |
| WO | WO 01/8452 * | 2/2001 |
| WO | WO 01/08452 | 2/2001 |
| WO | WO 01/93342 * | 12/2001 |
| WO | WO 01/93342 A1 | 12/2001 |
| WO | WO 02/099902 A1 | 12/2002 |
| WO | WO 03 102113 A1 | 12/2003 |

OTHER PUBLICATIONS

Cheng-Huang Kuo et al., "n-UV+Blue/Green/Red White Light Emitting Diode Lamps", Jpn. J. Appl. Phys., vol: 42 (2003) pp. 2284-2287, Part 1, No. 4B, Apr. 2003, The Japan Society of Applied Physics.

Young-Duk Huh, et al., "Optical Prperties of Three-Band White Light Emitting Diodes", Journal of The Electrochemical Society, 150(2) H57-H60 (Jan. 2003).

* cited by examiner

GARNET PHOSPHOR MATERIALS HAVING ENHANCED SPECTRAL CHARACTERISTICS

BACKGROUND OF THE INVENTION

The present invention relates to phosphor compositions, particularly phosphors for use in lighting applications. More particularly, the present invention relates to garnet phosphors having enhanced emissions in defined spectral regions compared to conventional garnet phosphors and a lighting apparatus employing these phosphors.

Light emitting diodes (LEDs) are semiconductor light emitters often used as a replacement for other light sources, such as incandescent lamps. They are particularly useful as display lights, warning lights and indicating lights or in other applications where colored light is desired. The color of light produce by an LED is dependent on the type of semiconducting material used in its manufacture.

Colored semiconductor light emitting devices, including light emitting diodes and lasers (both are generally referred to herein as LEDs), have been produced from Group III–V alloys such as gallium nitride (GaN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum. Until quite recently, LEDs have not been suitable for lighting uses where a bright white light is needed, due to the inherent color of the light produced by the LED.

LEDs rely on its semiconductor to emit light. The light is emitted as a result of electronic excitation of the semiconductor material. As radiation (energy) strikes atoms of the semiconductor material, an electron of an atom is excited and jumps to an excited (higher) energy state. The higher and lower energy states in semiconductor light emitters are characterized as the conduction band and the valence band, respectively. The electron, as it returns to its ground energy state, emits a photon. The photon corresponds to an energy difference between the exited state and ground energy state, and results in an emission of radiation.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum may be generated. Colored LEDs are often used in toys, indicator lights and other devices. Manufacturers are continuously looking for new colored phosphors for use in such LEDs to produce custom colors and higher luminosity.

In addition to colored LEDs, a combination of LED generated light and phosphor generated light may be used to produce white light. The most popular white LEDs consist of blue emitting GaInN chips. The blue emitting chips are coated with a phosphor that converts some of the blue radiation to a complimentary color, e.g. a yellow-green emission. Together, the blue and yellow-green radiation produces a white light. There are also white LEDs that utilize a UV emitting chip and a phosphor blend including red, green and blue emitting phosphors designed to convert the UV radiation to visible light.

One known yellow-whitish light emitting device comprises a blue light-emitting LED having a peak emission wavelength in the near UV-to-blue range (from about 315 nm to about 480 nm) combined with a yellow light-emitting phosphor, such as cerium doped yttrium aluminum garnet $(Tb,Y)_3Al_{4.9}O_{12-\delta}:Ce^{3+}$ ("TAG:Ce") wherein $\delta$ is typically between about $-1$ to $1$. The phosphor absorbs a portion of the radiation emitted from the LED and converts the absorbed radiation to a yellow light. The remainder of the blue light emitted by the LED is transmitted through the phosphor and is mixed with the yellow light emitted by the phosphor. A viewer perceives the mixture of blue and yellow light, which in most instances is perceived as a whitish-yellow light.

Such systems can be used to make white light sources having correlated color temperatures (CCTs) of >4500 K and color rendering indicies (CRIs) ranging from about 75–82. While this range is suitable for many applications, general illumination sources usually require higher CRIs and lower CCTs. One method of achieving this in blue LED devices requires that the phosphor emission be enhanced in the red spectral region compared to current yellow emission of conventional phosphors.

To accomplish this, phosphor blends utilizing deep red phosphors are sometimes used to produce light sources having a high color rendering index (CRI). Two deep red phosphors currently being used in such applications are $(Ca,Sr)S:Eu^{2+}$ and $(Ba,Sr,Ca)_xSi_yN_z:Eu^{2+}$. While effective, such phosphors may reabsorb emission from other phosphors (e.g. TAG:Ce) that may be present in the illumination device due to the overlapping of the $Eu^{2+}$ absorption bands in these materials with the emission of the other phosphors. Thus, a need exists for a new phosphor having a redder emission than TAG:Ce phosphors for use in LEDs displaying high quantum efficiency to produce both colored and white-light LEDs having a high CRI.

Another potential method to enhance the CRI of a lighting source using a blue or UV LED to excite a phosphor is to enhance the emission of the device in the blue-green region. Thus, a need exists for a phosphor having enhanced spectral output in this region when excited by blue or UV light.

SUMMARY OF THE INVENTION

In a first aspect, the invention provides a white-light emitting device including a semiconductor light source having a peak emission from about 250 to about 550 nm and a phosphor blend including a first phosphor comprising $(RE_{1-x-y}Sc_xCe_y)_2A_{3-p}B_pSi_{z-q}Ge_qO_{12+\delta}$, where RE is selected from a lanthanide ion or $Y^{3+}$, A is selected from Mg, Ca, Sr, or Ba, B is selected from Mg and Zn, and where $0 \le p \le 3$, $0 \le q \le 3$, $2.5 \le z \le 3.5$, $0 \le x \le 1$, $0 < y \le 0.3$, $-1.5 \le \delta \le 1.5$.

In a second aspect, the present invention provides a white light emitting device including a semiconductor light source having a peak emission from about 250 to about 500 nm and a phosphor composition having the formula $(Tb_{1-x-y-z-w}Y_xGd_yLu_zCe_w)_3M_rAl_{s-r}O_{12+\delta}$, where M is selected from Sc, In, Ga, Zn, or Mg, and where $0<w\leq0.3$, $0\leq x<1$, $0\leq y\leq0.4$, $0\leq z<1$, $0\leq r\leq4.5$, $4.5\leq s\leq6$, and $-1.5\leq\delta\leq1.5$.

In a third aspect, the present invention provides a phosphor having the formula $(RE_{1-x-y}Sc_xCe_y)_2A_{3-p}B_pSi_{z-q}Ge_qO_{12+\delta}$, where RE is selected from a lanthanide ion or $Y^{3+}$, A is selected from Mg, Ca, Sr, or Ba, B is selected from Mg and Zn, and where $0\leq p\leq3$, $0\leq q\leq3$, $2.5\leq z\leq3.5$, $0\leq x<1$, $0<y\leq0.3$, $-1.5\leq\delta\leq1.5$.

In a fourth aspect, the present invention provides a phosphor having the formula $(Tb_{1-x-y-z-w}Y_xGd_yLu_zCe_w)_3M_rAl_{s-r}O_{12+\delta}$, where M is selected from Sc, In, Ga, Zn, or Mg, and where $0<w\leq0.3$, $0\leq x<1$, $0\leq y\leq0.4$, $0\leq z\leq1$, $0\leq r\leq4.5$, $4.5\leq s\leq6$, and $-1.5\leq\delta\leq1.5$.

In a fifth aspect, the present invention provides a phosphor blend including a first phosphor having the formula $(Tb_{1-x-y-z-w}Y_xGd_yLu_zCe_w)_3M_rAl_{s-r}O_{12+\delta}$, where M is selected from Sc, In, Ga, Zn, or Mg, and where $0<w\leq0.3$, $0\leq x<1$, $0\leq y\leq0.4$, $0\leq z<1$, $0\leq r\leq4.5$, $4.5\leq s\leq6$, and $-1.5\leq\delta\leq1.5$, and a second phosphor having the formula $(RE_{1-x-y}Sc_xCe_y)_2A_{3-p}B_pSi_{z-q}Ge_qO_{12+\delta}$, where RE is selected from a lanthanide ion or $Y^{3+}$, A is selected from Mg, Ca, Sr, or Ba, B is selected from Mg and Zn, and where $0\leq p\leq3$, $0\leq q\leq3$, $2.5\leq z\leq3.5$, $0\leq x<1$, $0<y\leq0.3$, $-1.5\leq\delta\leq1.5$.

In a sixth aspect, the present invention provides a phosphor having the formula $(Ca_{1-x-y-z}Sr_xBa_yCe_z)_3(Sc_{1-a-c}Lu_aD_c)_2Si_{n-w}Ge_wO_{12+\delta}$, where D is either Mg or Zn, $0\leq x<1$, $0\leq y<1$, $0<z\leq0.3$, $0\leq a\leq1$, $0\leq c\leq1$, $0\leq w\leq3$, $2.5\leq n\leq3.5$, and $-1.5\leq\delta\leq1.5$.

In a seventh aspect, the present invention provides a light source including an LED having an emission wavelength of from about 250 to about 500 nm and a phosphor composition comprising $(Ca_{1-x-y-z}Sr_xBa_yCe_z)_3(SC_{1-a-c}Lu_aD_c)_2Si_{n-w}Ge_wO_{12+\delta}$, where D is either Mg or Zn, $0\leq x<1$, $0\leq y<1$, $0<z\leq0.3$, $0\leq a\leq1$, $0\leq c\leq1$, $0\leq w\leq3$, $2.5\leq n\leq3.5$, and $-1.5\leq\delta\leq1.5$.

In an eighth aspect, the present invention provides a phosphor that is a solid solution of the compositions given above.

In a ninth aspect including an LED having an emission wavelength of from about 250 to about 550 nm and a phosphor composition that comprises a solid solution of the compositions given above.

DETAILED DESCRIPTION OF THE INVENTION

Phosphors convert radiation (energy) to visible light. Different combinations of phosphors provide different colored light emissions. The colored light that originates from the phosphors provides a color temperature. Novel phosphor compositions are presented herein as well as their use in LED and other light sources.

A phosphor conversion material (phosphor material) converts generated UV or blue radiation to a different wavelength visible light. The color of the generated visible light is dependent on the particular components of the phosphor material. The phosphor material may include only a single phosphor composition or two or more phosphors of basic color, for example a particular mix with one or more of a yellow and red phosphor to emit a desired color (tint) of light. As used herein, the term "phosphor material" is intended to include both a single phosphor as well as a blend of two or more phosphors.

It was determined that an LED lamp that produces a bright-white light would be useful to impart desirable qualities to LEDs as light sources. Therefore, in one embodiment of the invention, a luminescent material phosphor conversion material blend (phosphor blend) coated LED is disclosed for providing white light. The individual phosphors and a phosphor blend including the individual phosphors convert radiation at a specified wavelength, for example radiation from about 250 to 550 nm as emitted by a near UV or blue LED, into visible light. The visible light provided by the phosphor blend comprises a bright white light with high intensity and brightness.

Figure 1:
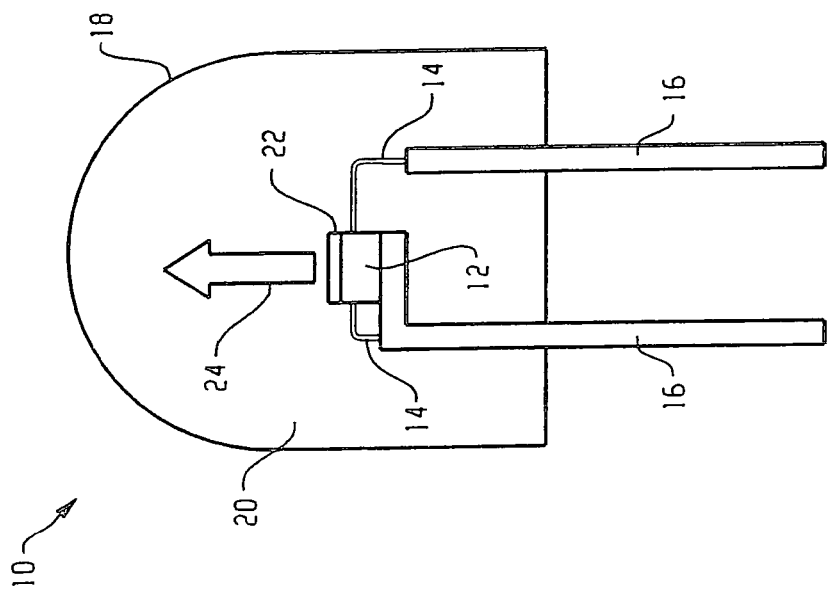
FIG. 1 is a schematic cross-sectional view of an illumination system in accordance with one embodiment of the present invention.

With reference to FIG. 1, an exemplary light emitting assembly or lamp 10 is shown in accordance with one preferred structure of the present invention. The light emitting assembly 10 comprises a semiconductor UV radiation source, such as a light emitting diode (LED) chip 12 and leads 14 electrically attached to the LED chip. The leads 14 may comprise thin wires supported by a thicker lead frame(s) 16 or the leads may comprise self supported electrodes and the lead frame may be omitted. The leads 14 provide current to the LED chip 12 and thus cause the LED chip 12 to emit radiation.

The lamp may include any semiconductor blue or UV light source that is capable of producing white light when its emitted radiation is directed onto the phosphor. In a preferred embodiment, the semiconductor light source comprises a blue emitting LED doped with various impurities. Thus, the LED may comprise a semiconductor diode based on any suitable III-V, II-VI or IV-IV semiconductor layers and having an emission wavelength of about 250 to 550 nm. Preferably, the LED may contain at least one semiconductor layer comprising GaN, ZnSe or SiC. For example, the LED may comprise a nitride compound semiconductor represented by the formula $In_iGa_jAl_kN$ (where $0\leq i$; $0\leq j$; $0\leq k$ and $i+j+k=1$) having an emission wavelength greater than about 250 nm and less than about 550 nm. Preferably, the chip is a blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

Organic light emissive structures are known in the art. A common high-efficiency organic emissive structure is referred to as the double heterostructure LED. This structure is very similar to conventional, inorganic LED's using materials as GaAs or InP. In this type of device, a support layer of glass is coated by a thin layer of indium/tin oxide (ITO) to form the substrate for the structure. Next, a thin (100–500 Å) organic, predominantly hole-transporting, layer (HTL) is deposited on the ITO layer. Deposited on the surface of the HTL layer is a thin (typically, 50–100 Å) emissive layer (EL). If these layers are too thin, there may be breaks in the continuity of the film; as the thickness of the film increases, the internal resistance increases, requiring higher power consumption for operation. The emissive layer (EL) provides the recombination site for electrons, injected from a 100–500 Å thick electron transporting layer (ETL) that is deposited upon the EL, and holes from the HTL layer. The ETL material is characterized by considerably higher mobility for electrons than for charge deficient centers (holes).

Another known organic emissive structure is referred to as a single heterostructure. The difference in this structure relative to that of the double heterostructure is that the electroluminescent layer also serves as an ETL layer, eliminating the need for the ETL layer. However, this type of device, for efficient operation, must incorporate an EL layer having good electron transport capability, otherwise a separate ETL layer must be included, rendering the structure effectively the same as a double heterostructure.

A known alternative device structure for an LED is referred to as a single layer (or polymer) LED. This type of device includes a glass support layer coated by a thin ITO layer, forming the base substrate. A thin organic layer of spin-coated polymer, for example, is then formed over the ITO layer, and provides all of the functions of the HTL, ETL, and EL layers of the previously described devices. A metal electrode layer is then formed over the organic polymer layer. The metal is typically Mg, Ca, or other conventionally used metals.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other high index of refraction material. Preferably, the encapsulant material 20 is an epoxy or a polymer material, such as silicone. Both the shell 18 and the encapsulant 20 are preferably transparent or substantially optically transmissive with respect to the wavelength of light produced by the LED chip 12 and a phosphor composition 22 (described below). Alternately, the lamp may 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame.

The structure of the illumination system includes a phosphor composition 22 radiationally coupled to the LED chip 12. Radiationally coupled means that the elements are associated with each other so radiation from one is transmitted to the other. In a preferred embodiment, the phosphor composition 22 is a blend of two or more phosphors, as will be detailed below. This phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of the phosphor composition 22 and LED 12. Thus, the phosphor composition 22 may be coated over or directly on the light emitting surface of the LED chip 12 by coating and drying the phosphor suspension over the LED chip 12. Both the shell 18 and the encapsulant 20 should be transparent to allow white light 24 to be transmitted through those elements. Although not intended to be limiting, in one embodiment, the median particle size of the phosphor composition may be from about 1 to about 10 microns.

Figure 2:
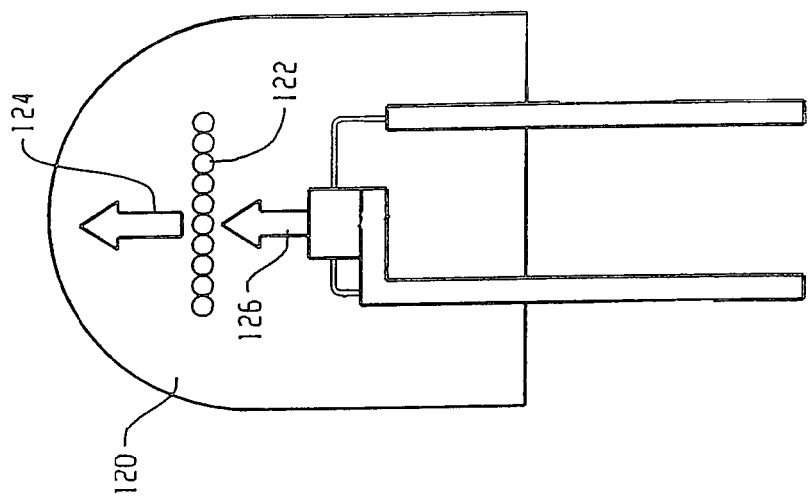
FIG. 2 is a schematic cross-sectional view of an illumination system in accordance with a second embodiment of the present invention.

FIG. 2 illustrates a second preferred structure of the system according to the preferred aspect of the present invention. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material 120 or, more preferably, throughout the entire volume of the encapsulant material. Blue light 126 emitted by the LED chip 112 mixes with the light emitted by the phosphor composition 122, and the mixed light appears as white light 124. If the phosphor is to be interspersed within the encapsulant material 120, then a phosphor powder may be added to a polymer precursor, loaded around the LED chip 112, and then the polymer precursor may be cured to solidify the polymer material. Other known phosphor interspersion methods may also be used, such as transfer loading.

Figure 3:
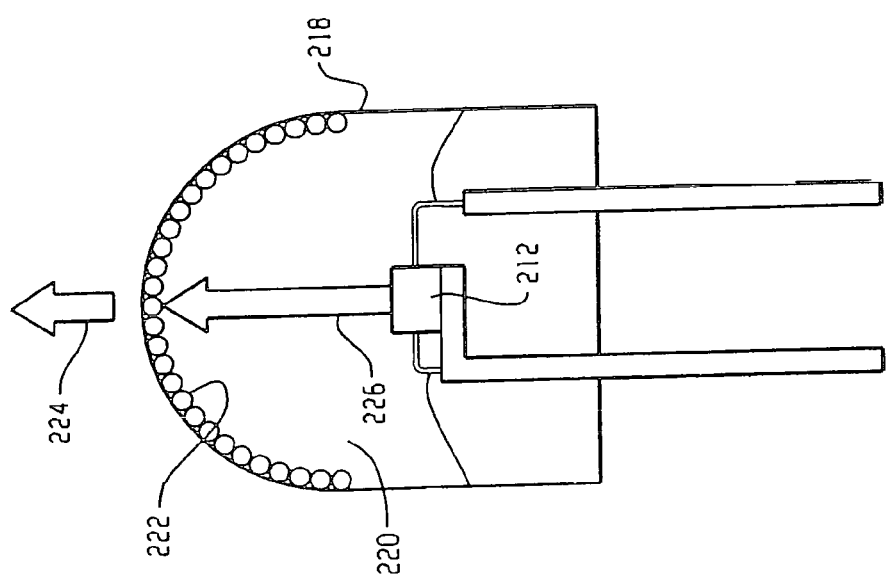
FIG. 3 is a schematic cross-sectional view of an illumination system in accordance with a third embodiment of the present invention.

FIG. 3 illustrates a third preferred structure of the system according to the preferred aspects of the present invention. The structure of the embodiment shown in FIG. 3 is similar to that of FIG. 1, except that the phosphor composition 222 is coated onto a surface of the shell 218, instead of being formed over the LED chip 212. The phosphor composition is preferably coated on the inside surface of the shell 218, although the phosphor may be coated on the outside surface of the shell, if desired. The phosphor composition 222 may be coated on the entire surface of the shell or only a top portion of the surface of the shell. The UV light 226 emitted by the LED chip 212 mixes with the light emitted by the phosphor composition 222, and the mixed light appears as white light 224. Of course, the structures of FIGS. 1–3 may be combined and the phosphor may be located in any two or all three locations or in any other suitable location, such as separately from the shell or integrated into the LED.

In any of the above structures, the lamp 10 may also include a plurality of scattering particles (not shown), which are embedded in the encapsulant material. The scattering particles may comprise, for example, $Al_2O_3$ particles such as alumina powder or $TiO_2$ particles. The scattering particles effectively scatter the coherent light emitted from the LED chip, preferably with a negligible amount of absorption.

Figure 4:
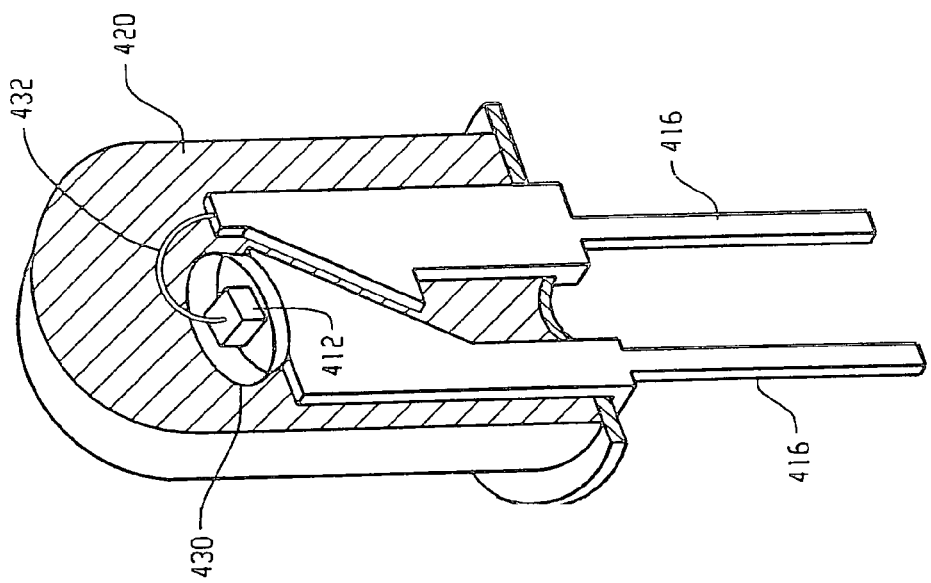
FIG. 4 is a cutaway side perspective view of an illumination system in accordance with a fourth embodiment of the present invention.

As shown in a fourth preferred structure in FIG. 4, the LED chip 412 may be mounted in a reflective cup 430. The cup 430 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, and an encapsulant material 420.

In one embodiment, the invention provides a novel phosphor composition, which may be used in the phosphor composition 22 in the above described LED light, having the general formula $(Tb_{1-x-y-z-w}Y_xGd_yLu_zCe_w)_3M_rAl_{s-r}O_{12+\delta}$, where M is selected from Sc, In, Ga, Zn, or Mg, and where $0<w\leq0.3$, $0\leq x<1$, $0\leq y\leq0.4$, $0\leq z<1$, $0\leq r\leq4.5$, $4.5\leq s\leq6$, and $-1.5\leq\delta\leq1.5$. A particularly preferred phosphor composition has the formula $(Tb_{0.57}Ce_{0.03}Y_{0.2}Gd_{0.2})_3Al_{s-r}O_{12+\delta}$. When used with an LED emitting at from 250 to 500 nm, the resulting lighting system will produce a light having a white color, the characteristics of which will be discussed in more detail below.

Figure 5:
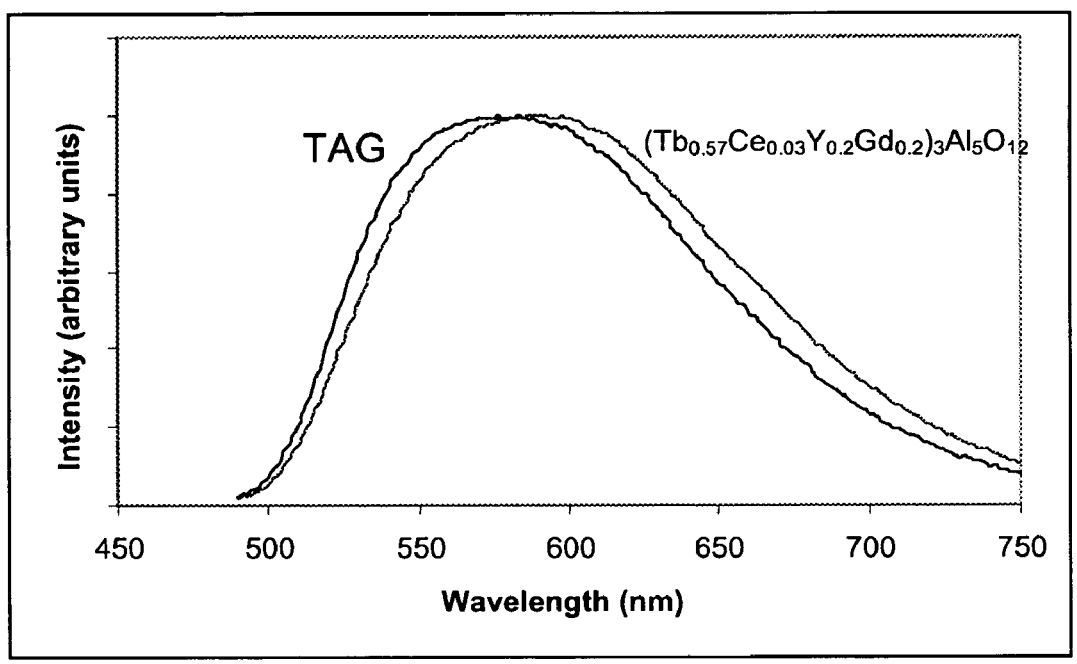
FIG. 5 is a graph of the emission spectra of a TAG phosphor and a phosphor according to the present invention having the formula $(Tb_{0.57}Y_{0.2}Gd_{0.2}Ce_{0.03})_3Al_{4.9}O_{12+\delta}$.

The above described formulation produces a phosphor with an emission having a deeper red component as compared to conventional TAG phosphor by shifting the $Ce^{3+}$ emission to a deeper red (i.e. longer) wavelength with the addition of isovalent ions. This effect is shown in FIG. 5, which shows the emission of a phosphor having the formula $(Tb_{0.57}Ce_{0.03}Y_{0.2}Gd_{0.2})_3Al_{4.9}O_{12+\delta}$ as compared to TAG. It can be seen that the modified TAG phosphor having a portion of Tb substituted by equal amounts of Y and Gd according to the above formula shifts the emission maximum towards the red compared to a conventional TAG phosphor.

Figure 6:
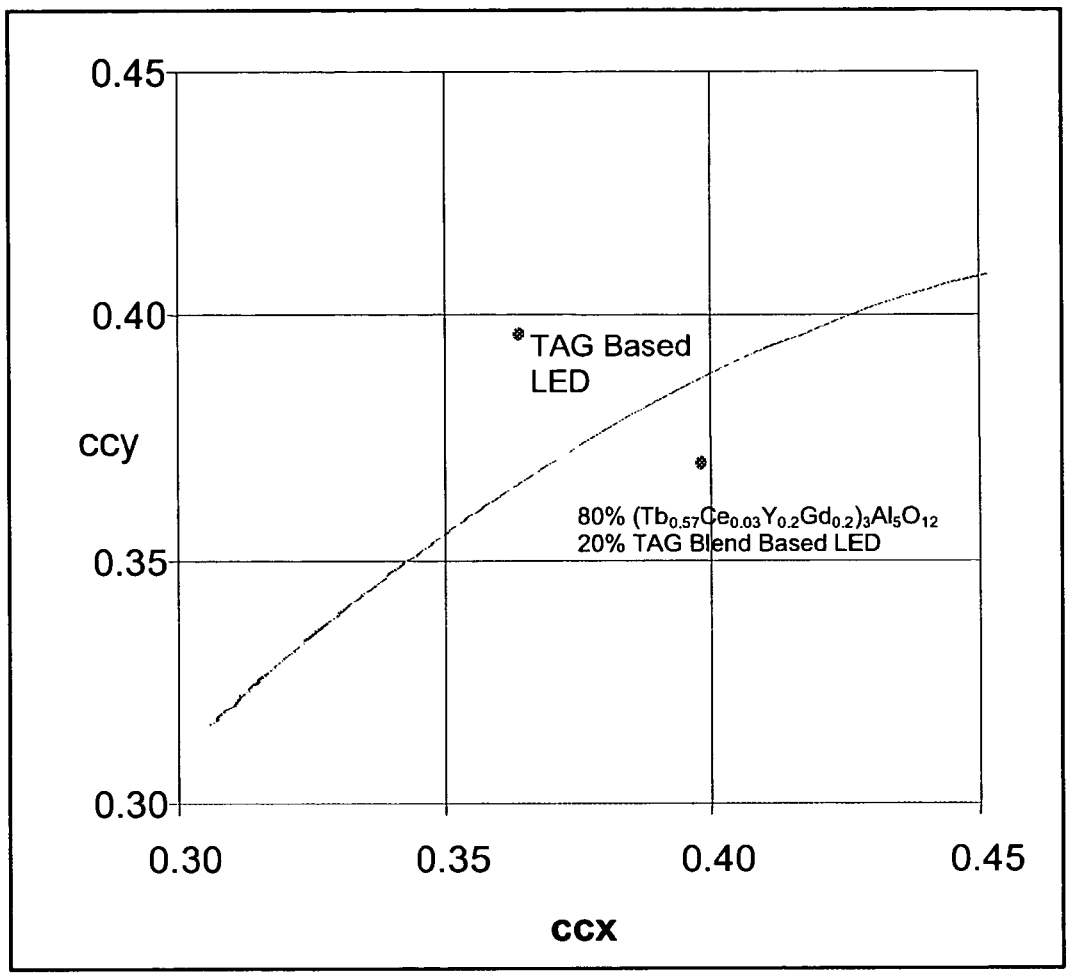
FIG. 6 is a graph of the color coordinates of light from LED illumination systems including different phosphor components on the CIE color chromaticity diagram.

When combined with a LED emitting at from 350–550 nm and, optionally, one or more additional phosphors, the use of the above phosphor allows for a white LED device having a higher CRI value and lower CCT as compared to a TAG based lighting device. LED devices having CCT values from about 2500 to about 10000, preferably from 2500 to 4500, and high CRI values from about 70 to 95 can be made. This allows for an increased ccx coordinate and a reduced ccy coordinate on the CIE color chromaticity diagram for the LED device, resulting in a "warmer" color LED. This effect can be seen in FIG. 6, which shows the color coordinates of otherwise identical LED lighting packages using different phosphor components. It can be seen than the LED using an 80/20 blend of $(Tb_{0.57}Ce_{0.03}Y_{0.2}Gd_{0.2})_3Al_{4.9}O_{12+\delta}$ and TAG:Ce has a greater ccx coordinate and a lower ccy coordinate than a comparable LED using TAG:Ce alone, which evidences a lower CCT.

In a second embodiment, the phosphor composition includes a phosphor composition with a garnet major phase and a secondary silicate phase having the formula $(RE_{1-x-y}Sc_xCe_y)_2A_{3-p}B_pSi_{z-q}Ge_qO_{12+\delta}$, where RE is selected from a lanthanide ion or $Y^{3+}$, A is selected from Mg, Ca, Sr, or Ba, B is selected from Mg and Zn, and where $0\leq p\leq3$, $0\leq q\leq3$, $2.5\leq z\leq3.5$, $0\leq x<1$, $0<y\leq0.3$, $-1.5\leq\delta\leq1.5$. The provision of z being from 2.5 to 3.5 allows for an "off-stoichiometric" phosphor without any significant changes in the luminescent properties of the material. In a preferred embodiment, RE=Y or Lu or Sc, with Lu or Sc particularly preferred, $y\leq0.05$, A=Ca or Mg, with Ca being particularly preferred, B=Mg, $2.9\leq z\leq3.1$, and $0\leq q/(z-q)\leq0.5$. A preferred composition of this embodiment having a redder emission color has the formula $(RE_{1-y}Ce_y)_2A_{3-p}B_pSi_{3-q}Ge_qO_{12+\delta}$, where y, p, and q are defined above and RE is Lu. A particularly preferred composition is $(Lu_{0.955}Ce_{0.045})_2CaMg_2Si_3O_{12}$.

Figure 7:
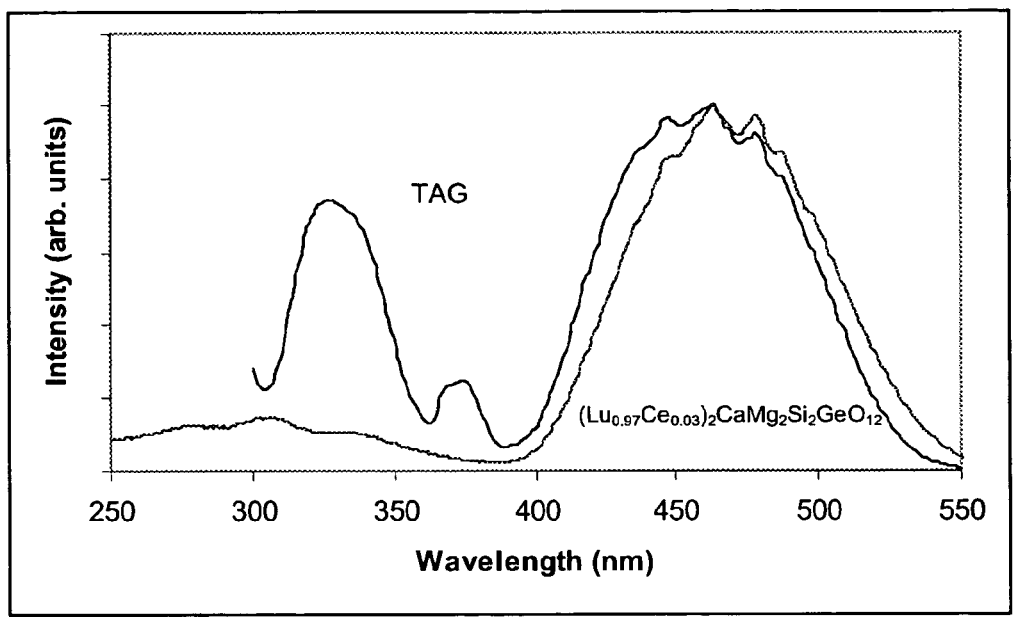
FIG. 7 is a graph of the excitation spectra of a TAG phosphor and a phosphor according to the present invention having the formula $(Lu_{0.97}Ce_{0.03})_2CaMg_2Si_2GeO_{12}$.
Figure 8:
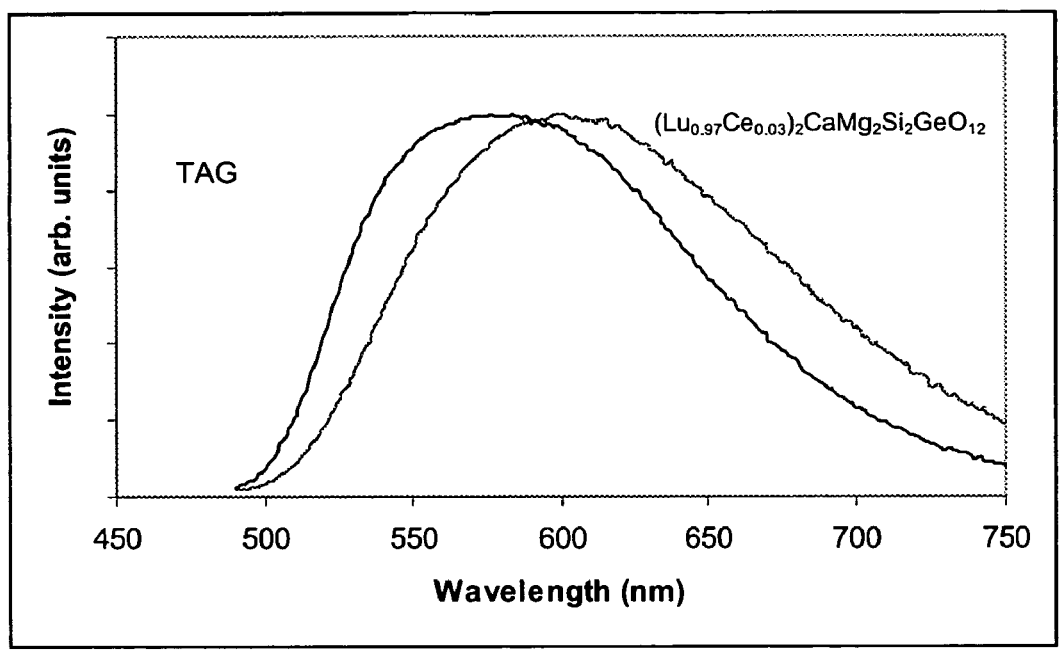
FIG. 8 is a graph of the emission spectra of a TAG phosphor and a phosphor according to the present invention having the formula $(Lu_{0.97}Ce_{0.03})_2CaMg_2Si_2GeO_{12}$.

FIGS. 7 and 8 show the absorption and emission spectra, respectively, of a $(Lu_{0.97}Ce_{0.03})_2CaMg_2Si_2GeO_{12}$ phosphor and a TAG:Ce phosphor. The emission spectra are under an excitation wavelength of 470 nm. As can be seen, the emission spectrum of the $(Lu_{0.97}Ce_{0.03})_2CaMg_2Si_2GeO_{12}$ phosphor shows a peak emission at a wavelength longer (i.e. redder) than TAG:Ce. In addition, the absorption spectra shows that the strongest absorption of the $(Lu_{0.97}Ce_{0.03})_2CaMg_2Si_2GeO_{12}$ phosphor is centered around 470 nm. This is advantageous when this phosphor is used in conjunction with additional phosphors, as it will be unlikely to significantly absorb emission from these other phosphors.

The versatility of the above phosphor compositions in LED lighting systems may be improved by the inclusion of Sc in the material. The peak emission of these materials compared to that of a conventional TAG:Ce phosphor can be shifted by controlling the amount of Sc in the host material. Thus, while the above phosphor compositions will typically have a significantly redder (longer wavelength) emission as compared to TAG:Ce, the addition of significant amounts of Sc to the phosphors will actually shift their emission to a comparable or even shorter wavelength as compared to TAG:Ce in the range of from about 0 to about 20 nm. Compositions that are rich in Sc (e.g. x=0.955 in the formula $(RE_{1-x-y}Sc_xCe_y)_2A_{3-p}B_pSi_{z-q}Ge_qO_{12+\delta}$ are yellow and can substitute for TAG:Ce in most applications, while Sc lean compositions (e.g. x=0.10 in the same formula) will have a significant red shift in comparison to TAG:Ce as described above. This results in a very versatile phosphor that can be used in a variety of applications by simply modifying the amount of individual components in the phosphor.

The above described phosphors may contain optically inert trace impurities including, for example, apatites such as $Ln_{9.33}(SiO_4)_6O_2$, and well as other silicates, such as $Ln_2Si_2O_7$ or $Ln_2SiO_5$. The presence of such impurities in an amount up to 10% by weight of the phosphor composition will not significantly affect the quantum efficiency or color of the phosphor.

In a third embodiment, the phosphor composition includes a phosphor composition having the formula $(Ca_{1-x-y-z}Sr_xBa_yCe_z)_3(Sc_{1-a-c}Lu_aD_c)_2Si_{n-w}Ge_wO_{12+\delta}$, where D is either Mg or Zn, $0\leq x<1$, $0\leq y<1$, $0<z\leq0.3$, $0\leq a\leq1$, $0\leq c\leq1$, $0\leq w\leq3$, $2.5\leq n\leq3.5$, and $-1.5\leq\delta\leq1.5$. In this embodiment, the LED preferably has a primary emission in the region of from 250 to 500 nm. In a preferred embodiment, $0\leq x\leq0.1$, $0\leq y\leq0.1$, $0<z\leq0.01$, $0\leq a\leq0.2$, D=Mg, $0\leq c\leq0.2$, $2.9\leq n\leq3.1$, $0\leq w/(n-w)\leq0.5$.

Depending on the exact formulation, this phosphor has a quantum efficiency of about 70% or greater of a typical YAG:Ce phosphor. Preferred specific embodiments of this phosphor include those where the Si,Ge component includes at least 66% $Si^{4+}$, at least 83% $Si^{4+}$ and 100% $Si^{4+}$. Thus, preferred specific embodiments include $Ca_3Sc_2(Si_xGe_{1-x})_3O_{12}$:Ce, where x is from 0.67 to 1.0.

Figure 9:
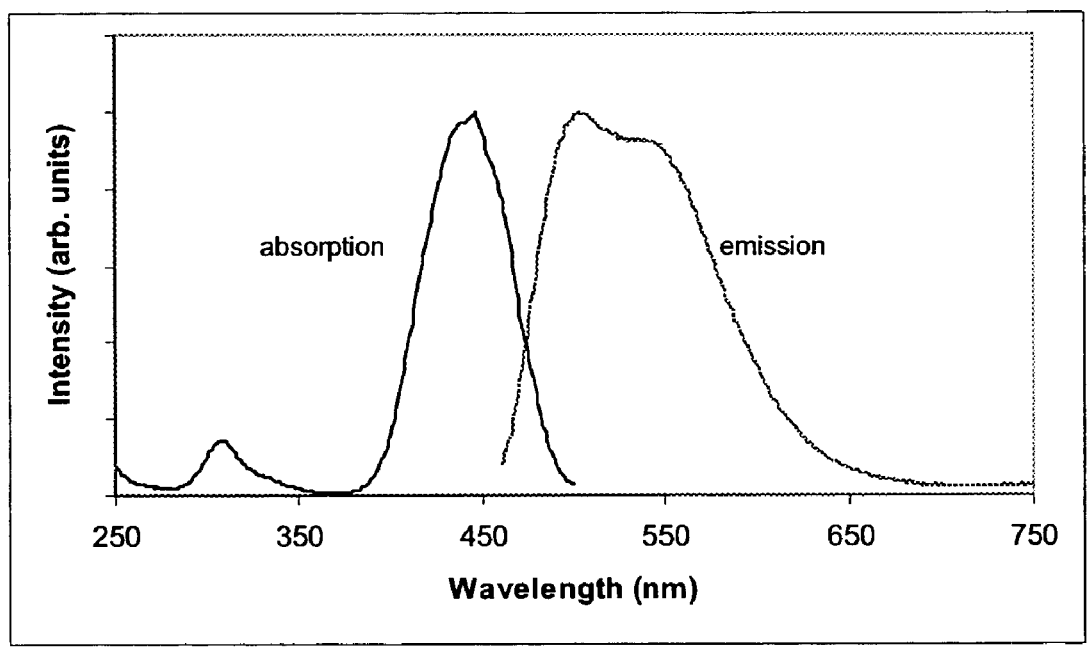
FIG. 9 is a graph of the emission and absorption spectra of $(Ca_{0.99}Ce_{0.01})_3Sc_2Si_3O_{12}$.

FIG. 9 shows an absorption and emission spectra for a phosphor having the formula $(Ca_{0.99}Ce_{0.01})_3Sc_2Si_3O_{12}$. This phosphor has less thermal quenching as compared to a conventional YAG:Ce phosphor with the ratio I(T)/(RT) ranging from about 1 at room temperature to about 0.8 at 250° C., indicating a very high quantum efficiency for these materials.

The above described phosphor compositions may be produced using known solid state reaction processes for the production of phosphors by combining, for example, elemental oxides, carbonates and/or hydroxides as starting materials. Other starting materials may include nitrates, sulfates, acetates, citrates, or oxalates. Alternately, coprecipitates of the rare earth oxides could be used as the starting materials for the RE elements. Si is typically provided via silicic acid, but other sources such as fumed silica may also be used. In a typical process, the starting materials are combined via a dry or wet blending process and fired in air or under a reducing atmosphere at from, e.g., 1000 to 1600° C.

A fluxing agent may be added to the mixture before or during the step of mixing. This fluxing agent may be $NH_4Cl$ or any other conventional fluxing agent, such as a fluoride of at least one metal selected from the group consisting of terbium, aluminum, gallium, and indium. A quantity of a fluxing agent of less than about 20, preferably less than about 10, percent by weight of the total weight of the mixture is adequate for fluxing purposes.

The starting materials may be mixed together by any mechanical method including, but not limited to, stirring or blending in a high-speed blender or a ribbon blender. The starting materials may be combined and pulverized together in a bowl mill, a hammer mill, or a jet mill. The mixing may be carried out by wet milling especially when the mixture of the starting materials is to be made into a solution for subsequent precipitation. If the mixture is wet, it may be dried first before being fired under a reducing atmosphere at a temperature from about 900° C. to about 1700° C., preferably from about 1000° C. to about 1600° C., for a time sufficient to convert all of the mixture to the final composition.

The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate. The reducing atmosphere typically comprises a reducing gas such as hydrogen, carbon monoxide, or a combination thereof, optionally diluted with an inert gas, such as nitrogen, helium, neon, argon, krypton, xenon, or a combination thereof. Alternatively, the crucible containing the mixture may be packed in a second closed crucible containing high-purity carbon particles and fired in air so that the carbon particles react with the oxygen present in air, thereby, generating carbon monoxide for providing a reducing atmosphere.

These compounds may be blended and dissolved in a nitric acid solution. The strength of the acid solution is chosen to rapidly dissolve the oxygen-containing compounds and the choice is within the skill of a person skilled in the art. Ammonium hydroxide is then added in increments to the acidic solution. An organic base such as methanolamine, ethanolamine, propanolamine, dimethanolamine, diethanolamine, dipropanolamine, trimethanolamine, triethanolamine, or tripropanolamine may be used in place of ammonium hydroxide.

The precipitate is filtered, washed with deionized water, and dried. The dried precipitate is ball milled or otherwise thoroughly blended and then calcined in air at about 400° C. to about 1600° C. for a sufficient time to ensure a substantially complete dehydration of the starting material. The calcination may be carried out at a constant temperature. Alternatively, the calcination temperature may be ramped from ambient to and held at the final temperature for the duration of the calcination. The calcined material is similarly fired at 1000–1600° C. for a sufficient time under a reducing atmosphere such as $H_2$, CO, or a mixture of one of theses gases with an inert gas, or an atmosphere generated by a reaction between a coconut charcoal and the products of the decomposition of the starting materials to covert all of the calcined material to the desired phosphor composition.

A sol-gel synthesis may also be used to produce the phosphors of the present invention. Thus, in an exemplary process, an $(LuCe)_2CaMg_2Si_3O_{12}$ phosphor according to the present invention can be made by first combining predetermined amounts of $Lu_2O_3$, $CaCO_3$, $MgCO_3$, $Ce_2(CO_3)_3*xH_2O$ and wetting them with water. Dilute nitric acid is then added to dissolve the oxide and carbonates. The solution is then dried to remove excess nitric acid and then dissolved in absolute ethanol. In a second container, a predetermined amount of tetraethyl orthosilicate (TEOS) is dissolved in absolute ethanol. The contents of the two containers are then combined and stirred under heat until gelling occurs. The gel is subsequently heated in an oven to remove organics, ground to a powder, and then calcined at 800–1200° C. Finally, the powder may be ground again and further calcined in 1% $H_2$ reducing atmosphere at 1400° C. for 5 hours. Similar procedures can be used for the other described phosphors.

While suitable in many applications alone with a blue or UV LED chip, the above two phosphor compositions may be blended with each other or one or more additional phosphors for use in LED light sources. Thus, in another embodiment, an LED lighting assembly is provided including a phosphor composition 22 comprising a blend of a phosphor from one of the above embodiments with one or more additonal phosphors. When used in a lighting assembly in combination with a blue or near UV LED emitting radiation in the range of about 250 to 550 nm, the resultant light emitted by the assembly will be a white light. In one embodiment, the phosphor composition comprises a blend of the two phosphors $(RE_{1-x-y}Sc_xCe_y)_2A_{3-p}B_pSi_{z-q}Ge_qO_{12+\delta}$, and $(Tb_{1-x-y-z-w}Y_xGd_yLu_zCe_w)_3M_rAl_{s-r}O_{12+\delta}$, as described above, and optionally one or more additional phosphors.

In another preferred embodiment, the phosphor composition includes a blend of any combination of $(RE_{1-x-y}Sc_xCe_y)_2A_{3-p}B_pSi_{z-q}Ge_qO_{12+\delta}$, $(Tb_{1-x-y-z-w}Y_xGd_yLu_zCe_w)_3 M_rAl_{s-r}O_{12+\delta}$, $(Ca_{1-x-y-z}Sr_xBa_yCe_z)_3(Sc_{1-a-c}Lu_aD_c)_2Si_{n-w}Ge_wO_{12+\delta}$ and TAG:Ce along with a blue-green phosphor and a red phosphor. The relative amounts of each phosphor in the phosphor composition can be described in terms of spectral weight. The spectral weight is the relative amount that each phosphor contributes to the overall emission spectra of the phosphor blend. The spectral weight amounts of all the individual phosphors should add up to 1. A preferred blend comprises a spectral weight of from 0.001 to 0.200 for the blue-green phosphor, from 0.001 to 0.300 of the red phosphor, and the balance of the blend being $(RE_{1-x-y}Sc_xCe_y)_2A_{3-p}B_pSi_{z-q}Ge_qO_{12+\delta}$, $(Tb_{1-x-y-z-w}Y_xGd_yLu_zCe_w)_3M_rAl_{s-r}O_{12+\delta}$, $(Ca_{1-x-y-z}Sr_xBa_yCe_z)_3(SC_{1-a-c}Lu_aD_c)_2Si_{n-w}Ge_wO_{12+\delta}$ and/or TAG:Ce. Any known blue-green and red phosphor suitable for use in UV or blue LED systems may be used. In addition, other phosphors such as green, blue, orange, or other color phosphors may be used in the blend to customize the white color of the resulting light and produce higher CRI sources. When used in conjunction with a LED chip emitting at from, e.g., 250 to 550 nm, the lighting system preferably includes a blue phosphor for converting some, and preferably all, of the LED radiation to blue light, which in turn can then be efficiently converted by the present inventive phosphors.

While not intended to be limiting, suitable phosphor for use in the blend with the present invention phosphors include:

Blue:
$(Ba,Sr,Ca)_5(PO_4)_3(Cl,F,Br, OH):Eu^{2+}, Mn^{2+}, Sb^{3+}$
$(Ba,Sr,Ca)MgAl_{10}O_{17}:Eu^{2+},Mn^{2+}$
$(Ba,Sr,Ca)BPO_5:Eu^{2+}, Mn^{2+}$
$(Sr,Ca)_{10}(PO_4)_6*nB_2O_3:Eu^{2+}$
$2SrO*0.84P_2O_5*0.16B_2O_3:Eu^{2+}$
$Sr_2Si_3O_{8*2}SrCl_2:Eu^{2+}$
$Ba_3MgSi_2O_8:Eu^{2+}$
$Sr_4Al_{14}O_{25}:Eu^{2+}$ (SAE)
$BaAl_8O_{13}:Eu^{2+}$ Blue-Green:
$Sr_4Al_{14}O_{25}:Eu^{2+}$
$BaAl_8O_{13}:Eu^{2+}$
$2SrO-0.84P_2O_{5-0.16}B_2O_3:Eu^{2+}$
$(Ba,Sr,Ca)MgAl_{10}O_{17}:Eu^{2+},Mn^{2+}$
$(Ba,Sr,Ca)_5(PO_4)_3(Cl,F,OH):Eu^{2+},Mn^{2+}, Sb^{3+}$ Green:
$(Ba,Sr,Ca)MgAl_{10}O_{17}:Eu^{2+},Mn^{2+}$ (BAMn)
$(Ba,Sr,Ca)Al_2O_4:Eu^{2+}$
$(Y,Gd,Lu,Sc,La)BO_3:Ce^{3+},Tb^{3+}$
$Ca_8Mg(SiO_4)_4Cl_2:Eu^{2+},Mn^{2+}$
$(Ba,Sr,Ca)_2SiO_4:Eu^{2+}$
$(Ba,Sr,Ca)_2(Mg,Zn)Si_2O_7:Eu^{2+}$
$(Sr,Ca,Ba)(Al,Ga,In)_2S_4:Eu^{2+}$
$(Y,Gd,Tb,La,Sm,Pr,Lu)_3(Al,Ga)_5O_{12}:Ce^{3+}$
$(Ca,Sr)_8(Mg,Zn)(SiO_4)_4Cl_2:Eu^{2+}, Mn^{2+}$ (CASI)
$Na_2Gd_2B_2O_7:Ce^{3+}, Tb^{3+}$
$(Ba,Sr)_2(Ca, Mg,Zn)B_2O_6:K,Ce,Tb$ Yellow-Orange:
$(Sr,Ca,Ba,Mg,Zn)_2P_2O_7:Eu^{2+}, Mn^{2+}$ (SPP);
$(Ca,Sr,Ba,Mg)_{10}(PO_4)_6(F,Cl,Br,OH):Eu^{2+},Mn^{2+}$ (HALO);

Red:
$(Gd,Y,Lu,La)_2O_3:Eu^{3+},Bi^{3+}$
$(Gd,Y,Lu,La)_2O_2S:Eu^{3+},Bi^{3+}$
$(Gd,Y,Lu,La)VO_4:Eu^{3+},Bi^{3+}$
$(Ca,Sr)S:Eu^{2+}$
$SrY_2S_4:Eu^{2+}$
$CaLa_2S_4:Ce^{3+}$
$(Ca,Sr)S:Eu^{2+}$
$3.5MgO*0.5MgF_2*GeO_2:Mn^{4+}$ (MFG)
$(Ba,Sr,Ca)MgP_2O_7:Eu^{2+},Mn^{2+}$
$(Y,Lu)_2WO_6:Eu^{3+}, Mo^{6+}$
$(Ba,Sr,Ca)_xSi_yN_z:Eu^{2+}$

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. As stated, a white light is preferably produced. This white light may, for instance, may possess an x value in the range of about 0.30 to about 0.55, and a y value in the range of about 0.30 to about 0.55. As stated, however, the exact identity and amounts of each phosphor in the phosphor composition can be varied according to the needs of the end user.

Various phosphor compositions according to the above formulation for the first embodiment phosphor were manufactured. The color coordinates of these phosphors were measured and the quantum efficiency ("QE") of these phosphors were compared to that of a TAG:Ce phosphor using a 470 nm excitation wavelength. The results are shown below in Table 1. The QE is given as a percent of the QE of the YAG:Ce phosphor.

TABLE 1

| Composition | QE (%) | Ccx | Ccy |
|---|---|---|---|
| $(Tb_{0.57}Ce_{0.03}Y_{0.2}Gd_{0.2})_3Al_{4.9}O_{12+\delta}$ | 96 | 0.495 | 0.497 |
| $(Tb_{0.57}Ce_{0.03}Y_{0.1}Gd_{0.3})_3Al_{4.9}O_{12+\delta}$ | 91 | 0.493 | 0.498 |
| $(Tb_{0.67}Ce_{0.03}Gd_{0.3})_3Al_{4.9}O_{12+\delta}$ | 77 | 0.487 | 0.504 |
| $(Tb_{0.57}Ce_{0.03}Gd_{0.4})_3Al_{4.9}O_{12+\delta}$ | 92 | 0.493 | 0.498 |
| $(Tb_{0.47}Ce_{0.03}Gd_{0.5})_3Al_{4.9}O_{12+\delta}$ | 58 | 0.488 | 0.502 |
| $(Tb_{0.37}Ce_{0.03}Y_{0.1}Gd_{0.5})_3Al_{4.9}O_{12+\delta}$ | 70 | 0.495 | 0.497 |
| $(Tb_{0.57}Ce_{0.03}Lu_{0.3}Gd_{0.1})_3Al_{4.9}O_{12+\delta}$ | 79 | 0.486 | 0.504 |
| $(Tb_{0.57}Ce_{0.03}Lu_{0.2}Gd_{0.2})_3Al_{4.9}O_{12+\delta}$ | 69 | 0.488 | 0.502 |
| $(Tb_{0.57}Ce_{0.03}Lu_{0.1}Gd_{0.3})_3Al_{4.9}O_{12+\delta}$ | 86 | 0.494 | 0.498 |
| $(Tb_{0.65}Ce_{0.05}Gd_{0.3})_3Al_{4.9}O_{12+\delta}$ | 70 | 0.486 | 0.505 |
| $(Tb_{0.63}Ce_{0.07}Gd_{0.3})_3Al_{4.9}O_{12+\delta}$ | 55 | 0.486 | 0.504 |
| $(Tb_{0.55}Ce_{0.05}Gd_{0.4})_3Al_{4.9}O_{12+\delta}$ | 84 | 0.491 | 0.500 |
| $(Tb_{0.55}Ce_{0.07}Gd_{0.4})_3Al_{4.9}O_{12+\delta}$ | 75 | 0.490 | 0.501 |

As can be seen from the above chart, a preferred composition according to the first embodiment of the present invention is $(Tb_{0.57}Ce_{0.03}Y_{0.2}Gd_{0.2})_3Al_{4.9}O_{12+\delta}$, which provides a QE comparable to that of TAG while having a significantly redder emission (ccx=0.495 and ccy=0.497 versus ccx=0.480 and ccy=0.510 for TAG), thus allowing for the production of white LEDs having lower CCT values than those available using TAG as a red emitting phosphor component.

When this phosphor is blended with another phosphor according to the second embodiment phosphor described above, this effect can be seen clearly. In this respect, Table 2 shows characteristics of LEDs comprising a blend of $(Tb_{0.57}Ce_{0.03}Y_{0.2}Gd_{0.2})_3Al_{4.9}O_{12+\delta}$ (phosphor 1) and $(Lu_{0.955}Ce_{0.045})_2CaMg_2Si_2GeO_{12}$ (phosphor 2) and an LED emitting at 470 nm. The percentages are the spectral weight of each emission component in the light emitted by the LED.

TABLE 2

| % 470 nm | % phosphor 1 | % phosphor 2 | CCT | CRI | Luminosity (lm/W-rad) |
|---|---|---|---|---|---|
| 22 | 78 | 0 | 3750 | 79 | 315 |
| 20 | 64 | 16 | 3470 | 78 | 314 |
| 17 | 50 | 33 | 3225 | 77 | 312 |
| 16 | 42 | 42 | 3110 | 76 | 310 |
| 15 | 34 | 51 | 3010 | 75 | 309 |
| 13 | 17 | 70 | 2816 | 74 | 304 |
| 11 | 0 | 89 | 2638 | 72 | 299 |

The blend of $(Tb_{0.57}Ce_{0.03}Y_{0.2}Gd_{0.2})_3Al_{4.9}O_{12+\delta}$ and $(Lu_{0.955}Ce_{0.045})_2CaMg_2Si_2GeO_{12}$ enables the production of LEDs with CCT's that are comparable to halogen and incandescent light sources while improving CRI at high CCTs as compared to TAG based LEDs. Thus, phosphor blends including the above disclosed phosphors can be used to produce LED lamps having CRI's of greater than 60 at CCT's of from 2500 to 8000, with CRI's preferably greater than 70.

The use of $(Ca,Sr,Ba)_3(Sc,Lu)_2(Si,Ge)_3O_{12}:Ce^{3+}$ in the above blends of $(Tb_{0.57}Ce_{0.03}Y_{0.2}Gd_{0.2})_3Al_{4.9}O_{12+\delta}$ and $(Lu_{0.955}Ce_{0.045})_2CaMg_2Si_2GeO_{12}$ can boost the CRI due to the additional blue-green emission of this phosphor.

The phosphor composition described above may be used in additional applications besides LEDs. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are meant to be merely exemplary and not exhaustive.

The invention has been described with reference to various preferred embodiments. Modifications and alteration will occur to others upon a reading and understanding of this specification. The invention is intended to include all such modifications and alterations insofar as they come within the scope of the appended claims or the equivalent thereof.

What is claimed is:

1. A lighting apparatus for emitting white light comprising:
   a light source emitting radiation at from about 250 to about 550 nm; and
   a phosphor composition radiationally coupled to the light source, the phosphor composition comprising $(RE_{1-x-y}Sc_xCe_y)_2A_{3-p}B_pSi_{z-q}Ge_qO_{12+\delta}$, where RE is selected from a lanthanide ion or $Y^{3+}$, A is selected from Mg, Ca, Sr, or Ba, B is selected from Mg and Zn, and where $0 \leq p \leq 3$, $0 \leq q \leq 3$, $2.5 \leq z \leq 3.5$, $0 \leq x < 1$, $0 < y \leq 0.3$, $-1.5 \leq \delta \leq 1.5$.

2. The lighting apparatus of claim 1, wherein the light source is a semiconductor LED emitting radiation having a wavelength in the range of from about 350 to about 550 nm.

3. The lighting apparatus of claim 2, wherein the LED comprises a nitride compound semiconductor represented by the formula $In_iGa_jAl_kN$, where $0 \leq i$; $0 \leq j$; $0 \leq K$, and $i+j+k=1$.

4. The lighting apparatus of claim 1, wherein said light source is an organic emissive structure.

5. The lighting apparatus of claim 1, wherein the phosphor composition is coated on the surface of the light source.

6. The lighting apparatus of claim 1, further comprising an encapsulant surrounding the light source and the phosphor composition.

7. The lighting apparatus of claim 1, wherein the phosphor composition is dispersed in the encapsulant.

8. The lighting apparatus of claim 1, further comprising a reflector cup.

9. The lighting apparatus of claim 1, wherein said phosphor composition comprises $(Lu_{0.955}Ce_{0.045})_2CaMg_2Si_3O_{12}$.

10. The lighting apparatus of claim 1, wherein said phosphor composition comprises two or more distinct phosphors having the formula $(RE_{1-x-y}Sc_xCe_y)_2A_{3-p}B_pSi_{z-q}Ge_qO_{12+\delta}$, where RE is selected from a lanthanide ion or $Y^{3+}$, A is selected from Mg, Ca, Sr, or Ba, B is selected from Mg and Zn, and where $0 \leq p \leq 3$, $0 \leq q \leq 3$, $2.5 \leq z \leq 3.5$, $0 \leq x < 1$, $0 < y \leq 0.3$, $-1.5 \leq \delta \leq 1.5$, wherein each of said distinct phosphors has a different emission spectrum.

11. The lighting apparatus of claim 1, wherein said phosphor composition further comprises one or more additional phosphors.

12. The lighting apparatus of claim 11, wherein said one or more additional phosphors are selected from the group consisting of $(Ba,Sr,Ca)_5(PO_4)_3(Cl,F,Br,OH):Eu^{2+}, Mn^{2+}, Sb^{3+}$; $(Ba,Sr,Ca)MgAl_{10}O_{17}:Eu^{2+},Mn^{2+}$; $(Ba,Sr,Ca)BPO_5:Eu^{2+},Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_8*2SrCl_2:Eu^{2+}$; $Ba_3MgSi_2O_8:Eu^{2+}$; $Sr_4Al_{14}O_{25}:Eu^{2+}$; $BaAl_8O_{13}:Eu^{2+}$; $(Ba,Sr,Ca)Al_2O_4:Eu^{2+}$; $(Y,Gd,Lu,Sc,La)BO_3:Ce^{3+},Tb^{3+}$; $Ca_8Mg(SiO_4)_4Cl_2:Eu^{2+},Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)^8(Mg,Zn)(SiO_4)_4Cl_2:Eu^{2+},Mn^{2+}$; $^{Na}_2Gd_2B_2O_7:Ce^{3+},Tb^{3+}$; $(Ba, Sr)_2(Ca,Mg,Zn)B_2O_6:K,Ce,Tb$; $(Sr,Ca,Ba,Mg,Zn)_2P_2O_7:Eu^{2+},Mn^{2+}$; $(Ca,Sr,Ba,Mg)_{10}(PO_4)_6(F,Cl,Br,OH):Eu^{2+},Mn^{2+}$; $(Gd,Y,Lu,La)_2O_3:Eu^{3+}, Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+}$; $SrY_2S_4:Eu^{2+}$; $CaLa_2S_4:Ce^{3+}$; $3.5MgO*0.5MgF_2*GeO_2:Mn^{4+}$; $(Ba,Sr,Ca)MgP_2O_7:Eu^{2+},Mn^{2+}$; $(Y,Lu)_2WO_6:Eu^{3+},Mo^{6+}$; $(Ba,Sr,Ca)_xSi_yN_z:Eu^{2+}$.

13. The lighting apparatus of claim 1, further comprising a $(Tb,Y)_3Al_{4.9}O_{12-\delta}:Ce^{3+}$ phosphor wherein $-1 \leq \delta \leq 1$.

14. The lighting apparatus of claim 1, wherein $2.9 \leq z \leq 3.1$.

15. The lighting apparatus of claim 1, wherein $0 \leq q/(z-q) \leq 0.5$.

16. The lighting apparatus of claim 1, wherein A is Ca.

17. The lighting apparatus of claim 1, wherein A is Mg.

18. The lighting apparatus of claim 1, wherein B is Mg.

19. The lighting apparatus of claim 1, wherein $y \leq 0.05$.

20. The lighting apparatus of claim 1, wherein said lighting apparatus has a CCT value from about 2500 to 8000.

21. The lighting apparatus of claim 1, wherein said lighting apparatus has a CRI value of greater than 60.

22. A phosphor composition comprising $(RE_{1-x-y}Sc_xCe_y)_2 A_{3-p}B_pSi_{z-q}Ge_qO_{12+\delta}$, where RE is selected from a lanthanide ion or $Y^{3+}$, A is selected from Mg, Ca, Sr, or Ba, B is selected from Mg and Zn, and where $0 \leq p \leq 3$, $0 \leq q \leq 3$, $2.5 \leq z \leq 3.5$, $0 \leq x < 1$, $0 < y \leq 0.3$, $-1.5 \leq \delta \leq 1.5$.

23. The phosphor composition according to claim 22, wherein $2.9 \leq z \leq 3.1$.

24. The phosphor composition according to claim 22, wherein $0 \leq q/(z-q) \leq 0.5$.

25. The phosphor composition according to claim 22, wherein A is Ca.

26. The phosphor composition according to claim 22, wherein A is Mg.

27. The phosphor composition according to claim 22, wherein B is Mg.

28. The phosphor composition according to claim 22, wherein $y \leq 0.05$.

29. The phosphor composition according to claim 22 comprising $(Lu_{0.955}Ce_{0.045})_2CaMg_2Si_3O_{12}$.

30. The phosphor composition according to claim 22, wherein said phosphor composition is capable of absorbing the radiation emitted by a light source emitting from 400–500 nm and emitting radiation that, when combined with said radiation from said light source, produces white light.

31. A phosphor blend including a first phosphor selected from the group consisting of $(Tb,Y)_3Al_{4.9}O_{12-\delta}:Ce^{3+}$ wherein $-1 \leq \delta \leq 1$ and $(Tb_{1-x-y-z-w}Y_xGd_jLu_zCe_w)_3M_rAl_{s-r}O_{12+\delta}$, where M is selected from Sc, In, Ga, Zn, or Mg, and where $0 < w \leq 0.3$, $0 \leq x < 1$, $0 \leq y \leq 0.4$, $0 \leq z < 1$, $0 \leq r \leq 4.5$, $4.5 \leq s \leq 6$, and $-1.5 \leq \delta \leq 1.5$, and a second phosphor having the formula $(RE_{1-x-y}Sc_xCe_y)_2A_{3-p}B_pSi_{z-q}Ge_qO_{12+\delta}$, where RE is selected from a lanthanide ion or $Y^{3+}$, A is selected from Mg, Ca, Sr, or Ba, B is selected from Mg and Zn, and where $0 \leq p \leq 3$, $0 \leq q \leq 3$, $2.5 \leq z \leq 3.5$, $0 \leq x < 1$, $0 < y \leq 0.3$, $-1.5 \leq \delta \leq 1.5$.

32. A phosphor composition comprising $(Ca_{1-x-y-z}Sr_xBa_yCe_z)_3(Sc_{1-a-c}Lu_aD_c)_2Si_{n-w}Ge_wO_{12+\delta}$, where D is either Mg or Zn, $0 \leq x < 1$, $0 \leq y < 1$, $0 < z \leq 0.3$, $0 \leq a < 1$, $0 \leq c \leq 1$, $0 \leq w \leq 1$, $2.5 \leq n \leq 3.5$, and $-1.5 \leq \delta \leq 1.5$.

33. The phosphor composition according to claim 32, comprising $(Ca_{1-z}Ce_z)_3Sc_2Si_{n-w}Ge_wO_{12}$.

34. The phosphor composition according to claim 33, comprising $(Ca_{1-z}Ce_z)_3Sc_2Si_3O_{12}$.

35. The phosphor composition according to claim 33, comprising $(Ca_{0.99}Ce_{0.01})_3Sc_2Si_3O_{12}$.

36. The phosphor composition according to claim 32, wherein said phosphor composition is capable of absorbing radiation having a wavelength of from about 250 to about 490 nm and emitting radiation with an emission maximum at about 505 nm.

37. The phosphor composition according to claim 32, wherein $2.9 \leq n \leq 3.1$.

38. The phosphor composition according to claim 32, wherein $x \leq 0.1$.

39. The phosphor composition according to claim 32, wherein $y \leq 0.1$.

40. The phosphor composition according to claim 32, wherein $z \leq 0.05$.

41. The phosphor composition according to claim 32, wherein $a \leq 0.10$.

42. The phosphor composition according to claim 32, further comprising $(Tb_{1-x-y-z-w}Y_xGd_yLu_zCe_w)_3M_rAl_{s-r}O_{12+\delta}$, where M is selected from Sc, In, Ga, Zn, or Mg, and where $0<w \leq 0.3$, $0 \leq x<1$, $0 \leq y \leq 0.4$, $0 \leq z<1$, $0 \leq r \leq 4.5$, $4.5 \leq s \leq 6$, and $-1.5 \leq \delta \leq 1.5$; and $(RE_{1-x-y}Sc_xCe_y)_2A_{3-p}B_p Si_{z-q}Ge_qO_{12+\delta}$, where RE is selected from a lanthanide ion or $Y^{3+}$, A is selected from Mg, Ca, Sr, or Ba, B is selected from Mg and Zn, and where $0 \leq p \leq 3$, $0 \leq q \leq 3$, $2.5 \leq z \leq 3.5$, $0 \leq x<1$, $0 \leq y \leq 0.3$, $-1.5 \leq \delta \leq 1.5$.

43. A lighting apparatus comprising a light source emitting radiation having an emission wavelength of from about 250 to about 500 nm and a phosphor composition comprising $(Ca_{1-x-y-z}Sr_xBa_yCe_z)_3(Sc_{1-a-c}Lu_aD_c)_2Si_{n-w}Ge_wO_{12+\delta}$, where D is either Mg or Zn, $0 \leq x<1$, $0 \leq y<1$, $0<z \leq 0.3$, $0 \leq a \leq 1$, $0 \leq c<1$, $0 \leq w \leq 3$, $2.5 \leq n \leq 3.5$, and $-1.5 \leq \delta \leq 1.5$.

44. The lighting apparatus of claim 43, wherein said lighting apparatus is a white light emitting device.

45. The lighting apparatus of claim 43, further comprising one or more additional phosphors.

46. The lighting apparatus of claim 45, wherein said one or more additional phosphors are selected from the group consisting of $(Ba,Sr,Ca)_5(PO_4)_3(Cl,F,Br,OH):Eu^{2+},Mn^{2+},Sb^{3+}$; $(Ba,Sr,Ca)MgAl_{10}O_{17}:Eu^{2+},Mn^{2+}$; $(Ba,Sr,Ca)BPO_5:Eu^{2+},Mn^{2+}$; $(Sr,Ca)_{10}(PO_4)_6*nB_2O_3:Eu^{2+}$; $2SrO*0.84P_2O_5*0.16B_2O_3:E^{2+}$; $Sr_2Si_3O_8*2SrCl_2:Eu^{2+}$; $Ba_3MgSi_2O_8:Eu^{2+}$; $Sr_4Al_{14}O_{25}:Eu^{2+}$; $BaAl_8O_{13}:Eu^{2+}$; $(Ba,Sr,Ca)Al_2O_4:Eu^{2+}$; $(Y,Gd,Lu,Sc,La)BO_3:Ce^{3+}, Tb^{3+}$; $Ca_8Mg(SiO_4)_4Cl_2:Eu^{2+}, Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2:Eu^{2+},Mn^{2+}$; $Na_2Gd_2B_2O_7:Ce^{3+}, Tb^{3+}$; $(Ba,Sr)_2(Ca,Mg,Zn)B_2O_6:K,Ce,Tb$; $(Sr,Ca,Ba,Mg,Zn)_2P_2O_7:Eu^{2+}, Mn^{2+}$; $(Ca,Sr,Ba,Mg)_{10}(PO_4)_6(F,Cl,Br,OH):Eu^{2+}, Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+}$; $SrY_2S_4:Eu^{2+}$; $CaLa_2S_4:Ce^{3+}$; $3.5MgO*0.5MgF_2*GeO_2:Mn^{4+}$; $(Ba,Sr,Ca)MgP_2O_7:Eu^{2+},Mn^{2+}$; $(Y,Lu)_2WO_6:Eu^{3+},Mo^{6+}$; $(Ba,Sr,Ca)_xSi_yN_z:Eu^{2+}$.

47. The lighting apparatus of claim 43, further comprising at least one phosphor selected from the group consisting of $(Tb_{1-x-y-z-w}Y_xGd_yLu_zCe_w)_3M_rAl_{s-r}O_{12+\delta}$, where M is selected from Sc, In, Ga, Zn, or Mg, and where $0<w \leq 0.3$, $0 \leq x<1$, $0 \leq y \leq 0.4$, $0 \leq z<1$, $0 \leq r \leq 4.5$, $4.5 \leq s \leq 6$, and $-1.5 \leq \delta \leq 1.5$; and further wherein at least one of y or z is $>0$; $(RE_{1-x-y}Sc_xCe_y)_2A_{3-p}B_pSi_{z-q}Ge_qO_{12+\delta}$, where RE is selected from a lanthanide ion or $Y^{3+}$, A is selected from Mg, Ca, Sr, or Ba, B is selected from Mg and Zn, and where $0 \leq p \leq 3$, $0 \leq q \leq 3$, $2.5 \leq z \leq 3.5$, $0 \leq x<1$, $0<y \leq 0.3$, $-1.5 \leq \delta \leq 1.5$; and $(Tb,Y)_3Al_{4.9}O_{12-\delta}:Ce^{3+}$ wherein $-1 \leq \delta \leq 1$.

48. The lighting apparatus of claim 43, wherein the light source is a semiconductor light emitting diode.

49. The lighting apparatus of claim 43, wherein said lighting apparatus has a CRI value of greater than 60.

50. The lighting apparatus of claim 43, wherein said phosphor comprises $Ca_3Sc_2(Si_xGe_{1-x})_3O_{12}:Ce^{3+}$, wherein x is from 0.67 to 1.0.

51. The lighting apparatus of claim 43, wherein said phosphor comprises $Ca_3Sc_2Si_3O_{12}:Ce^{3+}$.

52. The lighting apparatus of claim 43, wherein said phosphor comprises $(Ca_{0.99}Ce_{0.01})_3Sc_2Si_3O_{12}$.

* * * * *